United States Patent [19]

Bogenschütz et al.

[11] Patent Number: 4,721,549
[45] Date of Patent: Jan. 26, 1988

[54] METHOD AND APPARATUS FOR TREATING AT LEAST ONE CERAMIC OBJECT IN AN ALKALI HYDROXIDE MELT

[75] Inventors: August F. Bogenschütz, Oberdischingen; Josef L. Jostan; Robert Ostwald, both of Ulm, all of Fed. Rep. of Germany

[73] Assignee: Licentia Patent-Verwaltungs-GmbH, Frankfurt am Main, Fed. Rep. of Germany

[21] Appl. No.: 881,100

[22] Filed: Jul. 2, 1986

[30] Foreign Application Priority Data

Jul. 4, 1985 [DE] Fed. Rep. of Germany ....... 3523961

[51] Int. Cl.$^4$ .................. B44C 1/22; C03C 15/00; C03C 25/06
[52] U.S. Cl. ........................................ 156/663; 65/31; 134/2; 156/667; 156/345; 252/79.5; 427/309
[58] Field of Search ............... 252/79.5; 156/635, 639, 156/663, 667, 345; 427/309; 65/31; 134/2

[56] References Cited

U.S. PATENT DOCUMENTS 4,428,986 1/1984 Schachameyer ............... 156/663 X

FOREIGN PATENT DOCUMENTS 2233154 1/1975 France .
1070369 6/1967 United Kingdom ............... 156/663

*Primary Examiner*—William A. Powell
*Attorney, Agent, or Firm*—Spencer & Frank

[57] ABSTRACT

An apparatus for treating ceramic objects in alkali hydroxide melts for the purpose of cleaning and roughening them for a subsequent metallization. The apparatus permits various types of ceramics to be subjected to an etching treatment which can be predetermined and is easily reproducible with respect to the treatment temperature and time and the constant composition of the alkali hydroxide melt.

20 Claims, 2 Drawing Figures

METHOD AND APPARATUS FOR TREATING AT LEAST ONE CERAMIC OBJECT IN AN ALKALI HYDROXIDE MELT

BACKGROUND OF THE INVENTION

The present invention relates to an apparatus for treating a ceramic object in an alkali hydroxide melt, the apparatus being of the type which includes a heatable crucible for containing an alkali hydroxide melt in which ceramic objects are immersed, a heatable housing which is connected to the crucible in a substantially gas-tight manner to provide a preheating chamber above the crucible, a holder for moving the ceramic objects through the preheating chamber to the melt, and a nozzle arrangement which feeds a fluid mixture such as vapor and gas to the surface of the melt. The invention relates, in particular, to an apparatus for treating ceramic plates which are then metallized and processed into electrical circuits.

Ceramic objects are metallized to change, improve, or supplement the functional characteristics of the ceramic objects, such as electrical or thermal conductivity, resistance to corrosion, resistance to wear, or decorative characteristics. For such metallizations, the adhesion of the metal coating on the ceramic material is of particular significance. Very generally speaking, the adhesion is produced either by a relatively weak interaction between the material of the layer and the substrate (so-called Van der Waals forces), by chemical bonds, by metallic anchoring, or by a combination of these contributory factors. The percentages of these individual contributory factors depend primarily on the type of pretreatment received by the ceramic substrates. For example, the degree of adhesion provided by mechanical anchoring can be increased by a pretreatment which roughens the ceramic substrates.

Generally, the ceramic surfaces must be freed of their so-called glass-like firing skin, which makes most types of ceramic materials chemically inert. A suitable process must be employed to do this in a reproducible manner. The ceramic surfaces may be cleaned and activated in a chemical removal process so that chemical bonds can be developed with the surfaces of the ceramic crystallites that have been exposed. However, this removal process must neither excessively roughen the surfaces nor loosen the structure of the material since otherwise mechanical attachments would break out too easily. A chemical etching process which primarily removes the glass-like firing skin is therefore most suitable for this purpose. A number of etching agents have been proposed in the literature (see R. Bock: Aufschlussmethoden der anorganischen und organischen Chemie [Decomposition Methods Used in Organic and Inorganic Chemistry], published by Verlag Chemie, Weinheim/Bergstrasse, 1972) for treatment of aluminum oxide, which is the ceramic substrate material most commonly used in the electronics art. Examples of these etching agents are phosphoric acid, sulfuric acid, nitric acid and hydrofluoric acid or ammonium hydrogen fluoride, and sodium hydroxide solution or a sodium hydroxide melt. However, the acids have been found to be generally lacking in efficiency while the alkalis attack the ceramic surfaces only at a very high temperature, and then too strongly or irregularly. If the method of immersion pretreatment with a sodium hydroxide solution is employed, the layer must first be dried, where then the drawback of the danger of carbonate formation exists, and then fired. The firing must occur at a very high temperature (approximately 500° C.), with the small quantities of alkali hydroxide being distributed unevenly and going quickly through their reaction with the substrate so that no further etching can take place.

In the method of immersion pretreatment in a melt of an alkali hydroxide, no significantly stronger etching action can take place with sodium hydroxide even above the melting point of, for example, 318° C. An additional, grave drawback of this method is the fact that these extremely aggressive melts are difficult to handle, since they strongly attack practically all conventional instrument materials and since they form carbonates very easily by taking carbon dioxide from the ambient air, which adversely affects the etching conditions.

SUMMARY OF THE INVENTION

It is therefore an object of the present invention to improve the apparatus of this type so that the melt can be safely handled and so that it is possible to reproducibly and sufficiently strongly etch ceramic surfaces, particularly in industrial mass production.

This is accomplished by providing a ceramic treatment apparatus which includes a controllable immersion and extraction device for selectively stopping the holder of the ceramic objects above the preheating chamber, within the preheating chamber, and within the alkali hydroxide melt. Moreover it is advantageous to employ a fluid mixing arrangement which mixes water and inert gas, the mixture being provided to the nozzle arrangement via a helical pipe which serves as a resistance heating element, the nozzle arrangement being disposed above the surface of the melt.

DESCRIPTION OF THE PREFERRED EMBODIMENT

Pertinent portions of the apparatus illustrated in FIG. 2, which will be discussed in more detail below, are composed of a material which is resistant to etching alkali. Such materials include, for example, low-carbon nickel and/or gold-plated steel. As will be discussed a gas atmosphere free of carbon dioxide is disposed above the alkali hydroxide melt. This atmosphere is heated and thus the ceramic objects are preheated in the atmosphere. Moreover the atmosphere above the melt contains a certain quantity of water vapor and, by way of the partial pressure of the water vapor, the alkali hydroxide melt has a constant water content which is predetermined in the thermodynamic equilibrium. The water content of an exemplary sodium hydroxide melt has quite a decisive influence on the uniformity and degree of etching and/or roughening of a ceramic surface and thus on the adhesive anchorage of a metallized layer produced thereon.

Figure 1:
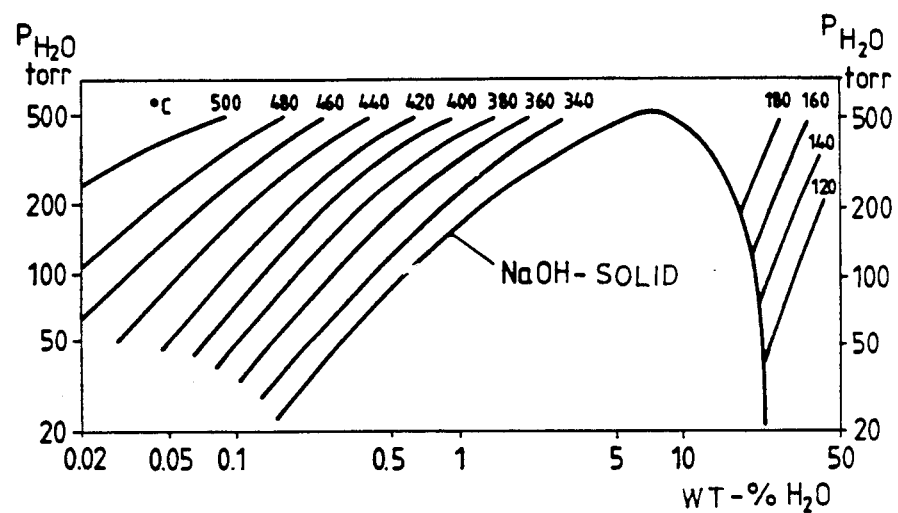
FIG. 1 is a diagram to describe the operation of the embodiment illustrated in FIG. 2.

FIG. 1 shows the water content of solid or liquid NaOH at various temperatures. The water content in FIG. 1 is measured in percent by weight (weight %) of the NaOH as a function of the partial water vapor pressure $P_{H_2O}$ measured in torr. In the illustrated group of curves, the temperature is measured in °C. It is thus possible, for a given H₂O content of an NaOH melt, to control and/or regulate the partial water vapor pressure above the melt in such a manner that the H₂O content in the melt remains unchanged.

Figure 2:
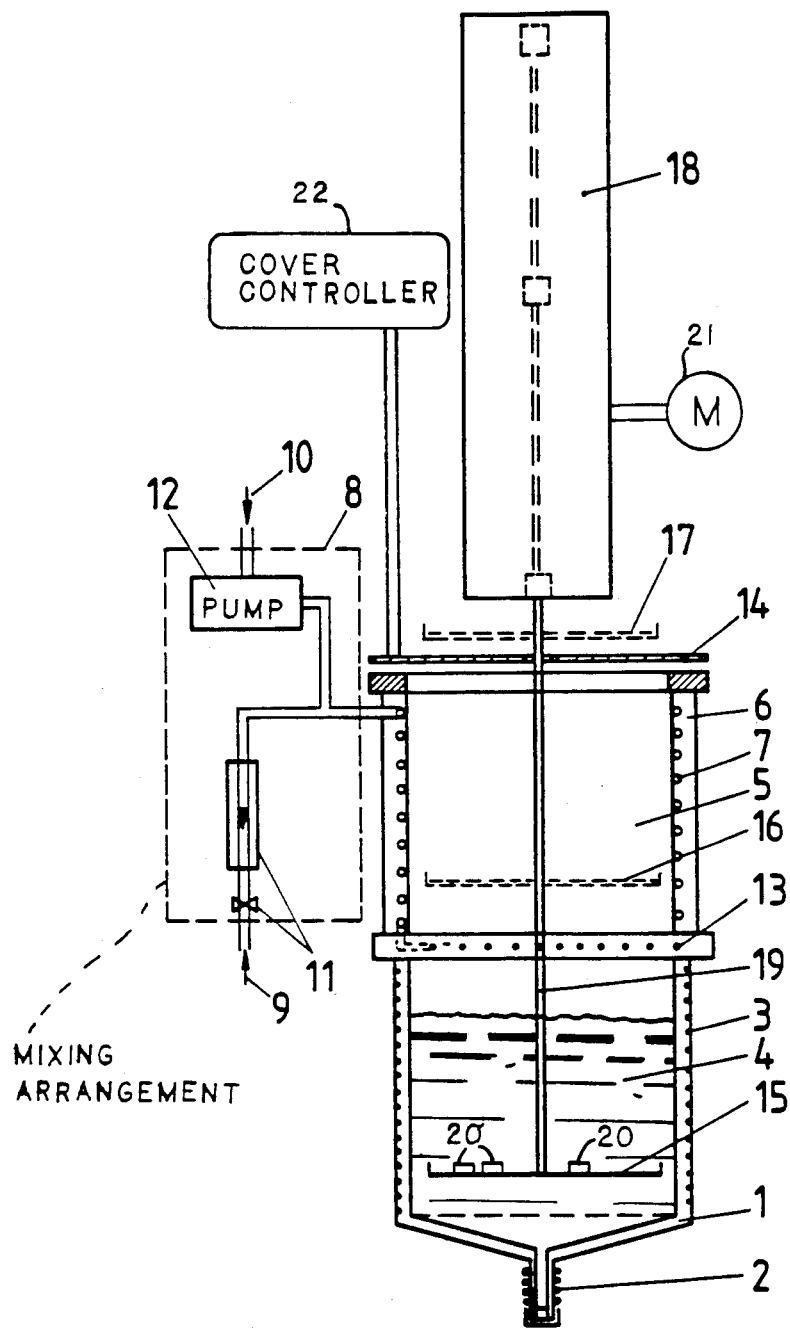
FIG. 2 is a schematic view, partially in section, illustrating an embodiment of the present invention.

In the embodiment according to FIG. 2, a melting crucible 1 is surrounded by an electrical crucible heating element 3 and is provided at its bottom with a heatable as well as closable outlet 2. In the melting crucible 1 there is provided an alkali hydroxide melt 4, for example an NaOH melt, which is kept at a temperature of approximately 325° C. Above the melting crucible 1, a heatable housing 6 is connected with the crucible in an essentially gas-tight manner, the heatable housing 6 having a preheating chamber 5 therein. The heatable housing 6 includes a helical pipe 7 which can be heated directly by electrical current. The upper end of helical pipe 7 is coupled with a fluid mixing arrangement such as gas and/or vapor mixing arrangement 8, to which is fed an inert gas 9 (for example, nitrogen) as well as demineralized water 10. The inert gas 9 flows through a control and/or regulating device 11 to produce an essentially constant gas stream. Via a dosaging pump 12, a precisely measured quantity of water is added to this gas stream. Thus, a gas and water vapor mixture is produced which is heated in helical pipe 7 and is conducted through a nozzle arrangement 13 onto the surface of the alkali hydroxide melt 4. In this way, the necessary partial water vapor pressure is always present above the alkali hydroxide melt 4, and carbonate formation is prevented. Preheating chamber 5 is covered by a cover 14.

The relationship between water content of the melt and partial pressure of the water vapor above the melt is determined by a series of experiments. For a sodium hydroxide melt at a constant temperature of 325° C., for example, different water contents in the melt can be achieved by regulating the nitrogen rate and water dosage in the manner illustrated in the table below:

TABLE

| $N_2 (R_1)$ (N l/h) | Water (ml/h) | $H_2O_{gas} (R_2)$ (N l/h) | $P(H_2O)$ (torr) | H₂O content of the melt (acc. to FIG. 1) (weight %) |
|---|---|---|---|---|
| 600 | 0 | 0 | 0 | 0 |
| 600 | 24 | 30 | 34 | 0.2 |
| 600 | 48 | 60 | 65 | 0.4 |
| 600 | 96 | 120 | 120 | 0.7 |
| 600 | 240 | 299 | 240 | 1.4 |
| 600 | 480 | 598 | 359 | 2.9 |
| 600 | 960 | 1196 | 479 | 4.9 |

In the Table (R₁) indicates the flow rate for nitrogen and (R₂) indicates the flow rate for vaporized water, both flow rates being given in liters per hour (l/h). The partial water vapor pressures $$P_{H_2O} = (R_2/R_1 + R_2)P$$

were calculated with the aid of the gas rates of nitrogen (R₁) and water vapor (R₂) for a total pressure P of 720 torr (at approximately 500 m above sea level). Melt 4 was left in these atmospheres for seven hours and was interrupted only by occasional stirring. Within this time, the equilibrium will set itself.

Into the thus-prepared alkali hydroxide melt 4, the ceramic bodies 20 (only a few of which are illustrated in FIG. 2), for example ceramic plates made of Al₂O₃ having a thickness of approximately 1 mm, are then introduced with the aid of a holder 15, for example a perforated plate made of pure nickel. In addition to the illustrated position in alkali hydroxide melt 4, holder 15 can also be fixed in a preheating position 16 in preheating chamber 5 and in a cooling position 17 above preheating chamber 5. This is accomplished by an immersion and extraction device 18 which is coupled with holder 15 by means of a rod assembly 19, the device 18 including and being driven by a motor 21.

Holder 15 is thus initially brought into the cooling position 17, with cover 14 closed, and is equipped with the ceramic bodies 20 to be treated. Then cover 14 is then opened automatically by a cover controller 22, holder 15 is lowered to the preheating position 16 (the cover closes automatically) and is left there for a preheating time of approximately 20 minutes. Thereafter, holder 15 is lowered further into the alkali hydroxide melt 4 so that the ceramic bodies 20 are etched there, for example for an etching period of about 10 minutes. Thereafter, holder 15 is pulled back into the preheating position 16, cover 14 is opened, holder 15 is brought to the cooling position 17 and cover 14 is closed again. After cooling, the ceramic bodies are removed and metallized in further process steps.

In the device described above, at least all parts which come into contact with the alkali hydroxide melt 4, for example, melting crucible 1 and holder 15, are manufactured of an etching alkali resistant material, for example of pure nickel LC which has a carbon content of less than 0.02% or of a CrNi steel which is heavily gold plated.

The above-described apparatus can be advantageously controlled and/or regulated in that the ceramic bodies are always treated according to the same process scheme in an economical and reproducible manner so that an accurately predeterminable, etched surface results which permits a very tightly adhering metallization.

The thus-prepared alkali hydroxide melt 4 has a water content in a preferred range of 4.0 weight percent (wt-%) to 5.0 weight percent.

In the nitrogen column ($N_2(R_1)$) and the water vapor column ($H_2O_{gas}(R_2)$) of the table on page 8 the meaning of "N" is "normal", corresponding to the volume of one liter of nitrogen or water vapor at normal conditions, that means at room temperatur (20° C.) and at an atmospheric pressure of 760 torr.

In the last column of the table on page 8 the H₂O content of the sodium hydroxide melt (325° C.) was obtained from the difference between the total water content within the system, consisting of the melting crucible 1 and the heatable housing 6, and the water vapor pressure above the melt.

In FIG. 1 the un-labeled curve represents a range where sodium hydroxide is solid. The left branch of the un-labeled curve, beginning at a very small water content and ending at the maximum at about 6 wt-% H₂O, corresponds to a temperature of about 325° C.

It will be understood that the above description of the present invention is susceptible to various modifications, changes and adaptations (for example a eutectic mixture composed of NaOH and KOH, such as 41 weight % NaOH and 59 weight % KOH, may be used as the alkali hydroxide melt, and the ceramic bodies may be made of porcelain), and the same are intended to be comprehended within the meaning and range of equivalents of the appended claims.

What we claim is:

1. An apparatus for treating at least one ceramic object in an alkali hydroxide melt, the apparatus comprising:
- a heatable melting crucible to contain the alkali hydroxide melt, said crucible having an upwardly disposed opening through which the at least one ceramic object is immersed into the alkali hydroxide melt;
- a heatable housing having a preheating chamber therein, said preheating chamber being disposed above said opening of said melting crucible and communicating with said melting crucible in a substantially gas-tight manner, said heatable housing having an upper end with an opening;
- a holder for the at least one ceramic object, said holder being movable through said opening of said heatable housing;
- cover for said opening of said heatable housing;
- a nozzle arrangement, above the alkali hydroxide melt in the crucible, through which a mixture of fluids can be fed to the surface of the alkali hydroxide melt; and
- a controllable immersion and extraction means connected to said holder for selectively stopping said holder above said preheating chamber, within said preheating chamber, and within the alkali hydroxide melt in the crucible.

2. An apparatus as defined in claim 1, wherein said crucible has an axis that is substantially vertical, wherein said crucible has a bottom through which said axis runs, and further comprising a closable outlet at said bottom of said crucible, said outlet being heatable.

3. An apparatus as defined in claim 1, further comprising a fluid mixing arrangement means for mixing the fluids that are fed to the surface of the alkali hydroxide melt, and wherein said housing of said preheating chamber includes an electrical resistance heating element configured as a helical pipe having an end that is connected with said nozzle arrangement and having another end that is coupled to said fluid mixing arrangement means.

4. An apparatus as defined in claim 3, wherein said mixture of fluids is a mixture of inert gas and water vapor and wherein said fluid mixing arrangement means mixes the inert gas and water, the mixture being heated in said helical pipe and being conducted through said nozzle arrangement to the alkali hydroxide melt.

5. An apparatus as defined in claim 4, wherein said inert gas is nitrogen.

6. Apparatus as defined in claim 4, wherein said fluid mixing arrangement means includes a control means for controlling the flow of inert gas, and dosaging pump means for dosaging the water that is mixed with the inert gas and evaporated at the heated end of the helical pipe.

7. An apparatus as defined in claim 4, wherein the fluid mixing arrangement means mixes water and inert gas at a ratio which provides a predetermined partial water vapor pressure above the alkali hydroxide melt in order to provide predetermined etching behavior in the melt.

8. An apparatus as defined in claim 4, wherein the mixture of inert gas and water vapor prevents carbon dioxide from reaching the alkali hydroxide melt and heats the at least one ceramic object when the at least one ceramic object is disposed in the preheating chamber.

9. An apparatus as defined in claim 1, wherein said immersion and extraction means comprises a motor to move and position said holder.

10. An apparatus as defined in claim 1, further comprising means for moving said cover in dependence on the position of said holder.

11. An apparatus as defined in claim 1, wherein at least said melting crucible is made of an etching alkali resistant material.

12. An apparatus for treating at least one ceramic object in an alkali hydroxide melt, the apparatus comprising:
- a heatable melting crucible to contain the alkali hydroxide melt, said crucible having an upwardly disposed opening through which the at least one ceramic object is immersed into the alkali hydroxide melt;
- a heatable housing having a preheating chamber therein, said preheating chamber being disposed above said opening of said melting crucible and communicating with said melting crucible in a substantially gas-tight manner, said heatable housing having an upper end with an opening;
- a holder for the at least one ceramic object, said holder being movable through said opening of said heatable housing;
- a cover for said opening of said heatable housing;
- a nozzle arrangement, above the alkali hydroxide melt in the crucible, through which a mixture of gas and vapor can be fed to the surface of the alkali hydroxide melt; and
- a controllable immersion and extraction means connected to said holder for selectively stopping said holder above said preheating chamber, within said preheating chamber, and within the alkali hydroxide melt in the crucible.

13. A method for treating ceramic objects in an apparatus which includes a heatable crucible that contains an alkali hydroxide melt, a heatable housing that is connected in a substantially gas-tight manner to the crucible to provide a preheating chamber above the melt, the heatable housing having an opening and a removable cover for the opening, and a nozzle arrangement disposed in the heatable housing, said method comprising the steps of:
- (a) continuously maintaining the water content of the melt at a predetermined constant value while simultaneously shielding the melt from carbon dioxide by flooding the preheating chamber with a heated mixture of inert gas that is introduced via the nozzle arrangement at a predetermined constant rate and water vapor that is introduced via the nozzle arrangement at a predetermined constant rate;
- (b) placing a ceramic object on a holder;
- (c) moving the holder into the preheating chamber;
- (d) keeping the holder in the preheating chamber for a predetermined preheating period;
- (e) moving the holder into the crucible to expose the ceramic object to the melt;
- (f) keeping the holder in the crucible for a predetermined etching period;
- (g) removing the holder from the apparatus;
- (h) replacing the ceramic object on the holder with another ceramic object; and
- (i) repeating steps (c) through (g).

14. A method according to claim 13, wherein the preheating period of step (d) is substantially the same for all of the ceramic objects that are treated and wherein the etching period of step (f) is substantially the same for all the ceramic objects that are treated.

15. A method according to claim 14, wherein the preheating period is about 20 minutes and wherein the etching period is about 20 minutes.

16. A method according to claim 13, wherein the nozzle arrangement is connected to a heated tube, and wherein step (a) comprises introducing inert gas into the heated tube at a constant rate, and simultaneously introducing water into the heated tube at a constant rate.

17. A method according to claim 13, wherein the step of introducing inert gas into the heated tube is conducted by introducing nitrogen into the heated tube, and wherein the step of introducing water into the heated tube is conducted by introducing water into the tube at a rate selected from the range of about 30 liters per hour to about 1196 liters per hour.

18. A method according to claim 13, wherein step (a) is conducted so as to maintain a substantially constant water vapor pressure within the preheating chamber, the water vapor partial pressure being selected from the range of about 34 torr and 479 torr.

19. A method according to claim 13, wherein the alkali hydroxide melt is composed of a eutectic mixture having an adjustable water content, and wherein step (e) is conducted by dipping the ceramic object into the eutectic mixture.

20. A method according to claim 13, wherein the alkali hydroxide melt is composed of a eutetic mixture containing potassium and sodium hydroxide and having an adjustable water content, and wherein step (e) is conducted by dipping the ceramic object into the eutectic mixture.

* * * * *